(12) United States Patent
Kimura et al.

(10) Patent No.: US 7,151,044 B2
(45) Date of Patent: Dec. 19, 2006

(54) THIN FILM TRANSISTOR TYPE DISPLAY DEVICE, METHOD OF MANUFACTURING THIN FILM ELEMENT, THIN FILM TRANSISTOR CIRCUIT BOARD, ELECTRO-OPTICAL DEVICE, AND ELECTRONIC APPARATUS

(75) Inventors: Mutsumi Kimura, Kyotanabe (JP); Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/764,502

(22) Filed: Jan. 27, 2004

(65) Prior Publication Data

US 2004/0256622 A1 Dec. 23, 2004

(30) Foreign Application Priority Data

Jan. 28, 2003 (JP) ............................. 2003-019131

(51) Int. Cl.
*H01L 21/30* (2006.01)
(52) U.S. Cl. .................... 438/458; 438/149; 438/455
(58) Field of Classification Search ............... 438/149, 438/455, 458
See application file for complete search history.

(56) References Cited

U.S. PATENT DOCUMENTS

2002/0173120 A1* 11/2002 Enquist ...................... 438/455

FOREIGN PATENT DOCUMENTS

| JP | A 6-308872 | 11/1994 |
|---|---|---|
| JP | A 2001-282423 | 10/2001 |
| JP | A 2001-282424 | 10/2001 |
| JP | A 2003-142666 | 5/2003 |
| JP | A 2003-297974 | 10/2003 |
| JP | A 2003-298006 | 10/2003 |

OTHER PUBLICATIONS

"A breakthrough technology . . . for leading edge microelectronics manufacturing"., www.holtronic.ch.
Shimoda et al., "Surface Free Technology by Laser Annealing (SUFTLA)", *IEEE*, 1999, pp. 289-292.
Utsunomiya et al., Low Temperature Poly-Si TFTs on Plastic Substrate Using Surface Free Technology by Laser Ablation/Annealing (SUFTLA™), *SID 00 DIGEST*, 2000, pp. 916-919.
Shimoda, "Future Trend of TFTs", *Asia Display/IDW '01*, pp. 327-330.
Utsunomiya et al., "Low Temperature Poly-Si TFT-LCD Transferred onto Plastic Substrate Using Surface Free Technology by Laser Ablation/Annealing (SUFTLA®)", *Asia Display/IDW '01*, pp. 339-342.
Shimoda, "Future Trend of TFT Technology", *AM-LCD '02*, pp. 5-8.

* cited by examiner

*Primary Examiner*—N. Drew Richards
(74) *Attorney, Agent, or Firm*—Oliff & Berridge, PLC

(57) ABSTRACT

The invention reduces the size of an element chip and reduces the manufacturing cost in a thin film transistor type display device in which thin film transistors are formed on a first substrate, wiring lines are formed on a second substrate, and the element chip, including one or more thin film transistors, is peeled off from the first substrate and transferred to the second substrate. In the patterning process of the thin film transistors, holographic lithography or a dynamic auto focus system is used, a design rule of 1.0 μm or less is used, and only a polycrystalline silicon layer and a first metal layer are used as the wiring lines of the element chip.

3 Claims, 5 Drawing Sheets

PRIOR ART

PRIOR ART

PRIOR ART

THIN FILM TRANSISTOR TYPE DISPLAY DEVICE, METHOD OF MANUFACTURING THIN FILM ELEMENT, THIN FILM TRANSISTOR CIRCUIT BOARD, ELECTRO-OPTICAL DEVICE, AND ELECTRONIC APPARATUS

BACKGROUND OF THE INVENTION

1. Field of Invention

The present invention relates to a thin film transistor type display device. More specifically, the invention relates to a thin film transistor type display device in which thin film transistors are formed on a first substrate, wiring lines are formed on a second substrate, and an element chip including one or more thin film transistors is peeled off from the first substrate and transferred to the second substrate.

2. Description of Related Art

In a related art thin film transistor type display device provided with thin film transistors, wiring lines therebetween, and a supporting substrate, there are many cases where the thin film transistors form a part of the whole display device, and the wiring lines and the supporting substrate form the remaining part thereof. When a thin film transistor type display device is manufactured, through the same manufacturing processes, after the thin film transistors, the wiring lines, and the supporting substrate are integrated, highly complicated manufacturing processes are required to make highly functional thin film transistors. Thus, the manufacturing cost generally increases. However, highly complicated manufacturing processes are not required to make only the wiring lines and the supporting substrate, and the manufacturing cost thereof is low. If the thin film transistors, wiring lines, and supporting substrate can be separately made, and the desired quantity of thin film transistors can then be disposed, it is possible to reduce the average manufacturing cost of the thin film transistor type display device as a whole.

Therefore, other related art thin film transistor type display devices can be provided such that thin film transistors are formed on a first substrate, wiring lines are formed on a second substrate, and an element chip including one or more thin film transistors is peeled off from the first substrate and transferred to the second substrate. According to this method, since the desired quantity of thin film transistors can be disposed, it is possible to reduce the average manufacturing cost of the thin film transistor type display device as a whole. In addition, laser ablation or adhesive are used for the peeling or transferring process, respectively.

FIG. 1 is a schematic of a method of peeling and transferring an element chip. A peeling layer 12 is formed on a first substrate 11, thin film transistors 13 and connecting pads 14 are formed on the peeling layer 12, and an element chip 16, which is separated with separators 15, is formed. Wiring lines 18 and connecting pads 19 are formed on the second substrate 17, and they are coated with adhesive 1a. The first substrate 11 and the second substrate 17 are contact-bonded to each other, and the adhesive 1a is caused to flow, thereby electrically connecting the connecting pads 14 of the element chip 16 to the connecting pads 19 of the second substrate 17. The adhesive 1a does not flow to other adjacent element chips 16 due to the separators 15. The element chip 16, including one or more thin film transistors 13, is peeled off from the first substrate 11 by laser ablation with irradiation from a laser 1b, and is transferred to the second substrate 17.

FIG. 2 is a plan view of a related art element chip. An element chip 26 including one or more thin film transistors 25 includes a polycrystalline silicon layer 21, a first metal layer 22, a second metal layer 23, and contact holes 24. In the patterning processes of all the layers, normal stepper lithography is used, and a design rule with a line/space/alignment precision=5 μm/5 μm/5 μm is used. The thin film transistors 25 form a pixel circuit of organic light emitting diodes in the element chip 26. The reason why two metal layers, such as the first metal layer 22 and the second metal layer 23, are used is that the present thin film transistor type display device requires transverse and longitudinal bus lines in order to display two-dimensional images, and the bus lines should have low resistance to reduce the time constant and voltage drop therein in consideration of the actual size of the thin film transistor type display device. The area of the element chip 26 is 150 μm×85 μm=12750 μm$^2$.

FIG. 3 is a schematic of a method of manufacturing a related art element chip. A peeling layer 32 is formed on a first substrate 31, and a base insulating film 33 is formed on the peeling layer 32. An amorphous silicon (a-Si) layer 34 is deposited using PECVD of $SiH_4$, LPCVD of $Si_2H_6$, etc., and it is crystallized and patterned with laser irradiation 35 to obtain a polycrystalline silicon (poly-Si) layer 36. A gate insulating film 37 is deposited using PECVD or ECR-CVD of TEOS, etc., a resistive mask 39 is used to selectively implant dopant ions by ion implantation or ion doping 38, and source/drain regions 3a are formed. Gate metal is deposited and patterned to obtain gate electrodes 3b. The gate electrodes 3b are used to selectively implant dopant ions by ion implantation, ion doping 3c, etc., to form lightly doped drain regions (LDD) 3d.

An interlayer insulating film 3e is deposited, and contact holes 3f are formed. Source/drain metal is deposited and patterned to obtain source/drain electrodes 3g. The source/drain electrodes 3g are also used as connecting pads. Thin film transistors 3h are obtained from the above processes. Finally, an element chip 3j is formed by the separation with separators 3i. Although only one element chip 3j is illustrated in FIG. 3, a number of element chips 3j is arranged.

On the other hand, the related art includes methods of manufacturing thin film transistors known as holographic lithography and dynamic auto focus (white light focus: WLF) systems. According to the holographic lithography method, in the patterning process of thin film transistors, a fine design rule, for example, 1.0 μm or less can be used. Further, according to the dynamic auto focus system, the surface swelling of a large substrate can be compensated for. As a result, the lithography can be made with high precision. (For example, as disclosed in T. Shimoda, et al, Tech. Dig. IEDM 1999, 289; S. Utsunomiya, et al, Dig. Tech. Pap. SID 2000, 916; T. Shimoda, Proc. Asia Display/IDW '01, 327; S. Utsunomiya, et al, Proc. Asia Display/IDW '01, 339; T. Shimoda, Dig. Tech. Pap. AM-LCD 02, 5; http://www.holtronic.ch).

SUMMARY OF THE INVENTION

In the thin film transistor type display device in which thin film transistors are formed on a first substrate, wiring lines are formed on a second substrate, and an element chip including one or more thin film transistors is peeled off from the first substrate and transferred to the second substrate, a desired number of the thin film transistors can be disposed. As a result, the average manufacturing cost of the thin film transistor type display device as a whole can be reduced. At this time, the size of the element chip affects the manufacturing cost greatly. The present invention reduces the size of an element chip and reduces the manufacturing cost.

In order to address or solve the above, the present invention provides a thin film transistor type display device in which thin film transistors are formed on a first substrate, wiring lines are formed on a second substrate, and an element chip including one or more thin film transistors is peeled off from the first substrate and transferred to the second substrate. Holographic lithography is used in the patterning process of the thin film transistors.

According to the above configuration, it is possible to use a fine design rule in the patterning process of thin film transistors, reduce the size of element chips, and reduce the manufacturing cost.

Further, the present invention provides a thin film transistor type display device in which thin film transistors are formed on a first substrate, wiring lines are formed on a second substrate, and an element chip including one or more thin film transistors is peeled off from the first substrate and transferred to the second substrate. A dynamic auto focus system is used in the patterning process of the thin film transistors.

According to the above configuration, it is possible to compensate for the surface swelling of a large substrate. As a result, it is possible to expose the substrate with high precision and uniformity, to reduce the size of element chips, and to reduce the manufacturing cost.

Moreover, the present invention provides the above-mentioned thin film transistor type display device in which a design rule of 1.0 µm or less is used in the patterning process of the thin film transistors.

According to the above configuration, lithography can be uniformly made with high precision using a design rule of 1.0 µm or less by holographic lithography or a dynamic auto focus system. As a result, it is possible to reduce the size of element chips and reduce the manufacturing cost.

Furthermore, the present invention provides the above-mentioned thin film transistor type display device in which only a polycrystalline silicon layer and a first metal layer are used as the wiring lines of the element chip.

According to the above configuration, it is possible to further reduce the manufacturing cost by simplifying the manufacturing processes while keeping the size-reduction effect of element chips in the holographic lithography or dynamic auto focus system.

In order to address or solve the above, the present invention provides a method of manufacturing thin film elements including: transferring functional elements formed on a first substrate to a second substrate, forming the functional elements in a predetermined shape on the first substrate via a peeling layer which causes peeling by the application of a predetermined amount of energy, and transferring at least one of the functional elements to the second substrate by applying the energy to relevant portions of the peeling layer corresponding to the regions of the functional elements to cause peeling. Holographic lithography is used to pattern the functional elements in the forming of the functional elements in a predetermined shape.

Further, the functional elements are preferably thin film transistors.

Further, the present invention provides a thin film transistor circuit board, an electro-optical device, and an electronic apparatus which includes the above thin film transistors.

DETAILED DESCRIPTION OF PREFERRED EMBODIMENTS

Exemplary embodiments of the present invention are explained below. In addition, a series of aspects about a transfer method is also described in Japanese Unexamined Patent Application Publication Nos. 2001-282423, 2001-282424, etc., which are disclosed by the present applicant.

Figure 1:
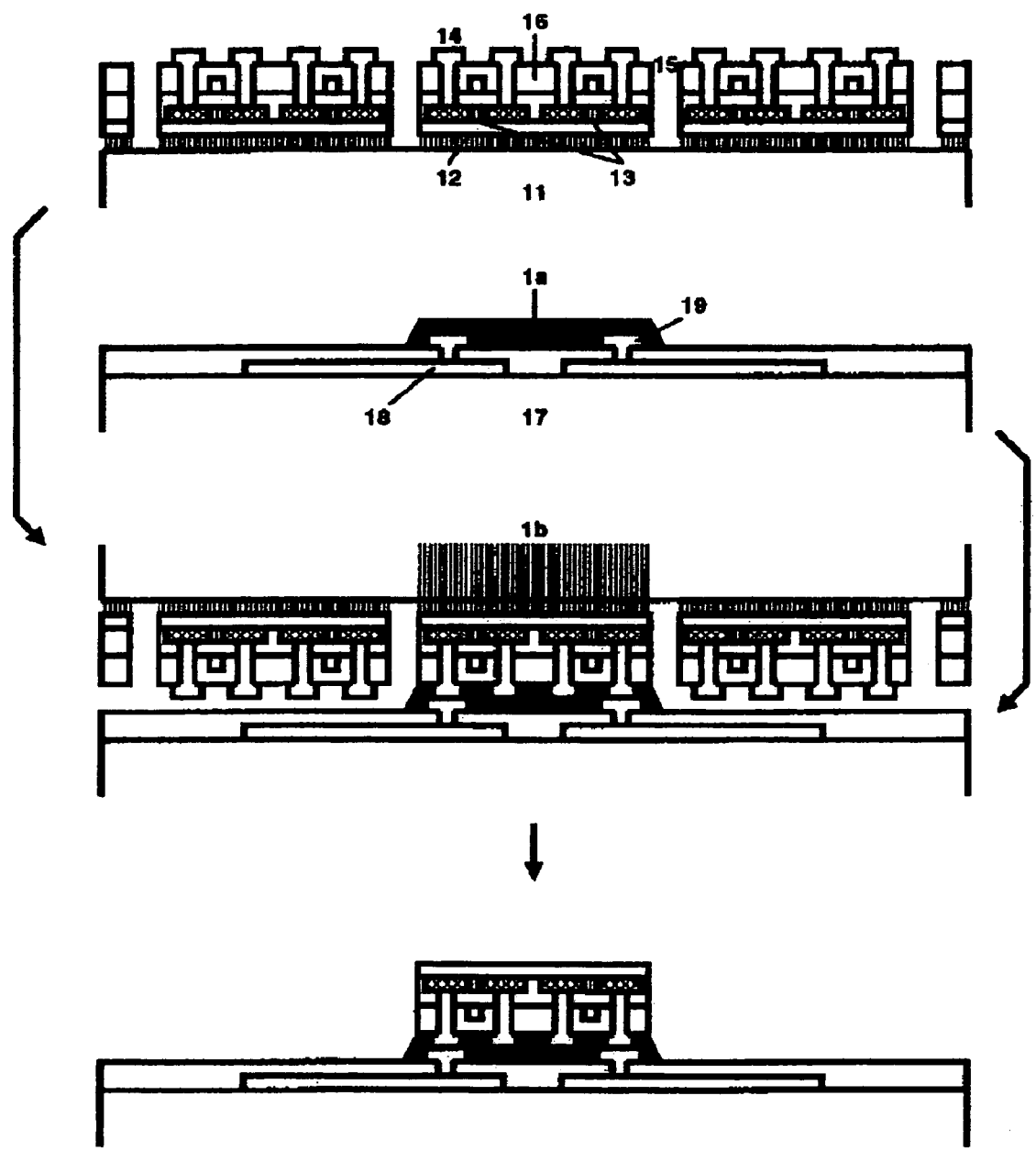
FIG. 1 is a schematic of a method of peeling and transferring an element chip.
Figure 2:
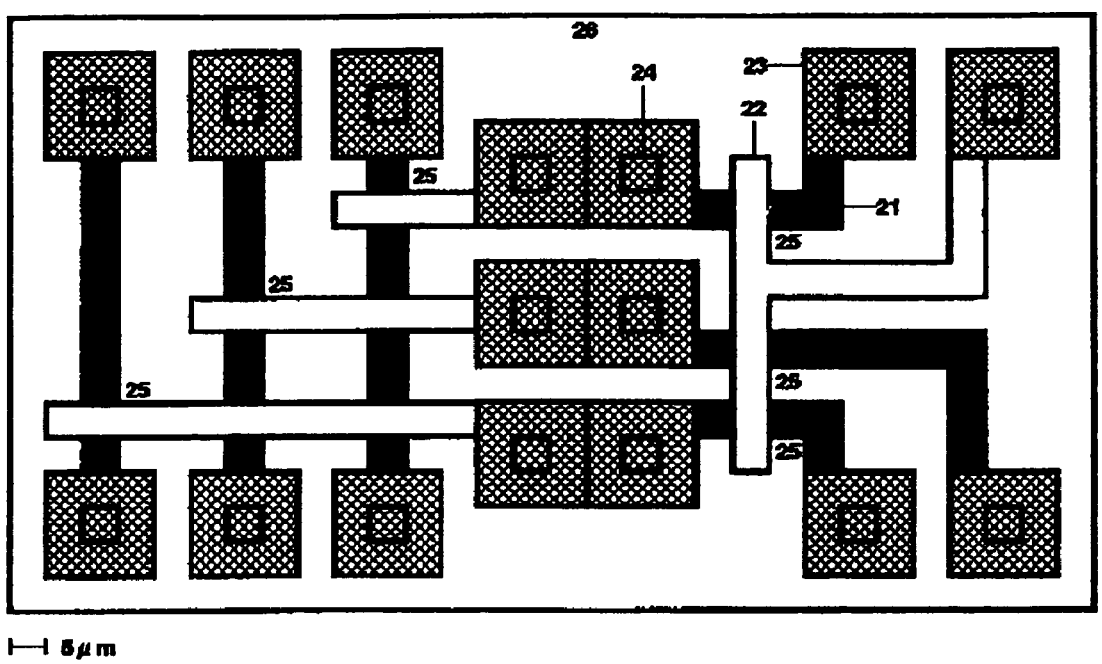
FIG. 2 is a plan view of a related art element chip.
Figure 3:
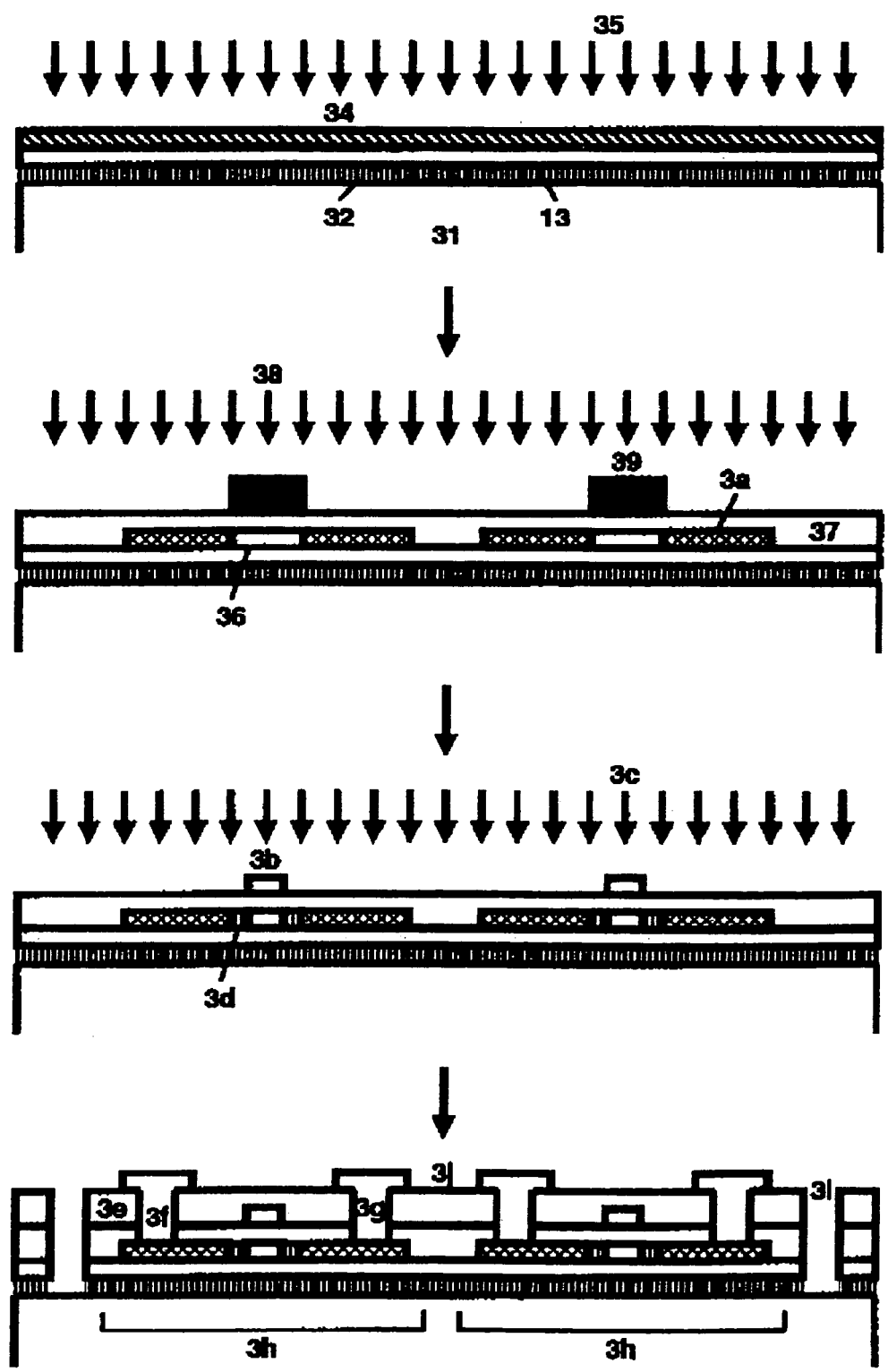
FIG. 3 is a schematic of a method of manufacturing a related art element chip.
Figure 4:
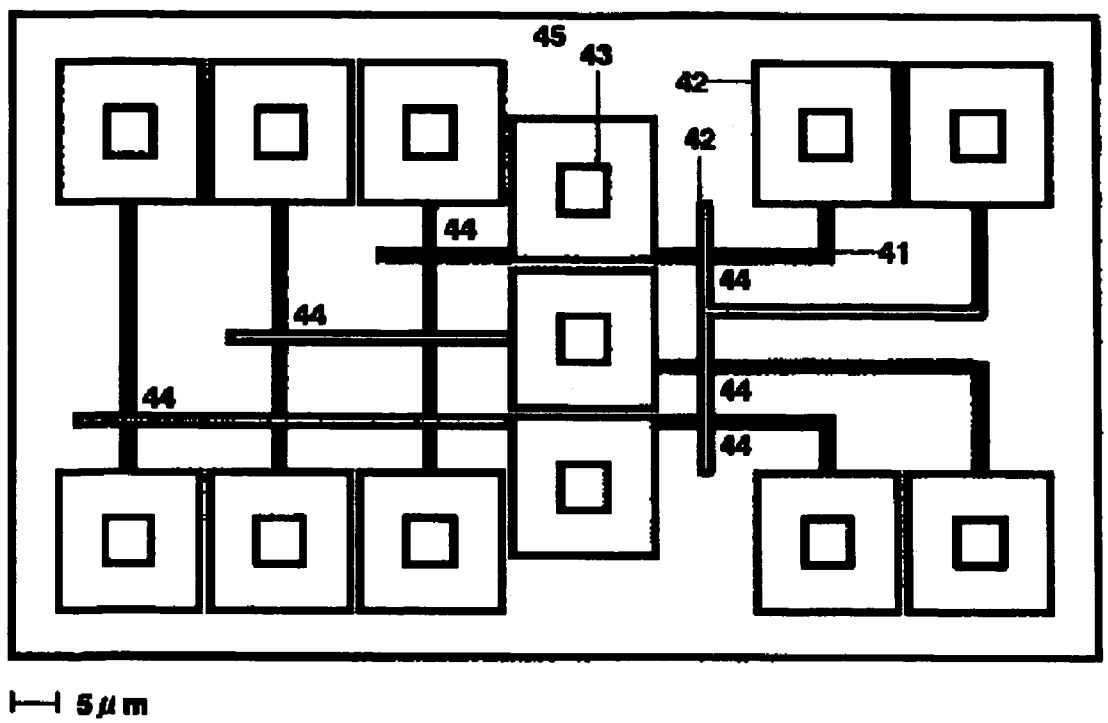
FIG. 4 is a plan view of an element chip according to an exemplary embodiment of the present invention.

FIG. 4 is a plan view of an element chip according to an exemplary embodiment of the present invention. An element chip 45 including one or more thin film transistors 44 includes a polycrystalline silicon layer 41, a first metal layer 42, and contact holes 43. In the patterning processes of the polycrystalline silicon layer 41 and the first metal layer 42, holographic lithography or a dynamic auto focus system is used, and a design rule of line/space=1 µm/1 µm is used. In the patterning processes of other layers, normal stepper lithography is used, and a design rule of line/space=5 µm/5 µm is used. In the patterning processes of all the layers, a design rule with an alignment precision=5 µm is used. The thin film transistors 44 form a pixel circuit of organic light emitting diodes in the element chip 45. Although only the polycrystalline silicon layer 41 and the first metal layer 42 are used, the time constant and voltage drop do not cause problems because the element chip 45 is small compared to the overall size of the display device. The area of the element chip 45 is 115 µm×69 µm=7935 µm$^2$, which is only 62% as large as a related art element chip.

Figure 5:
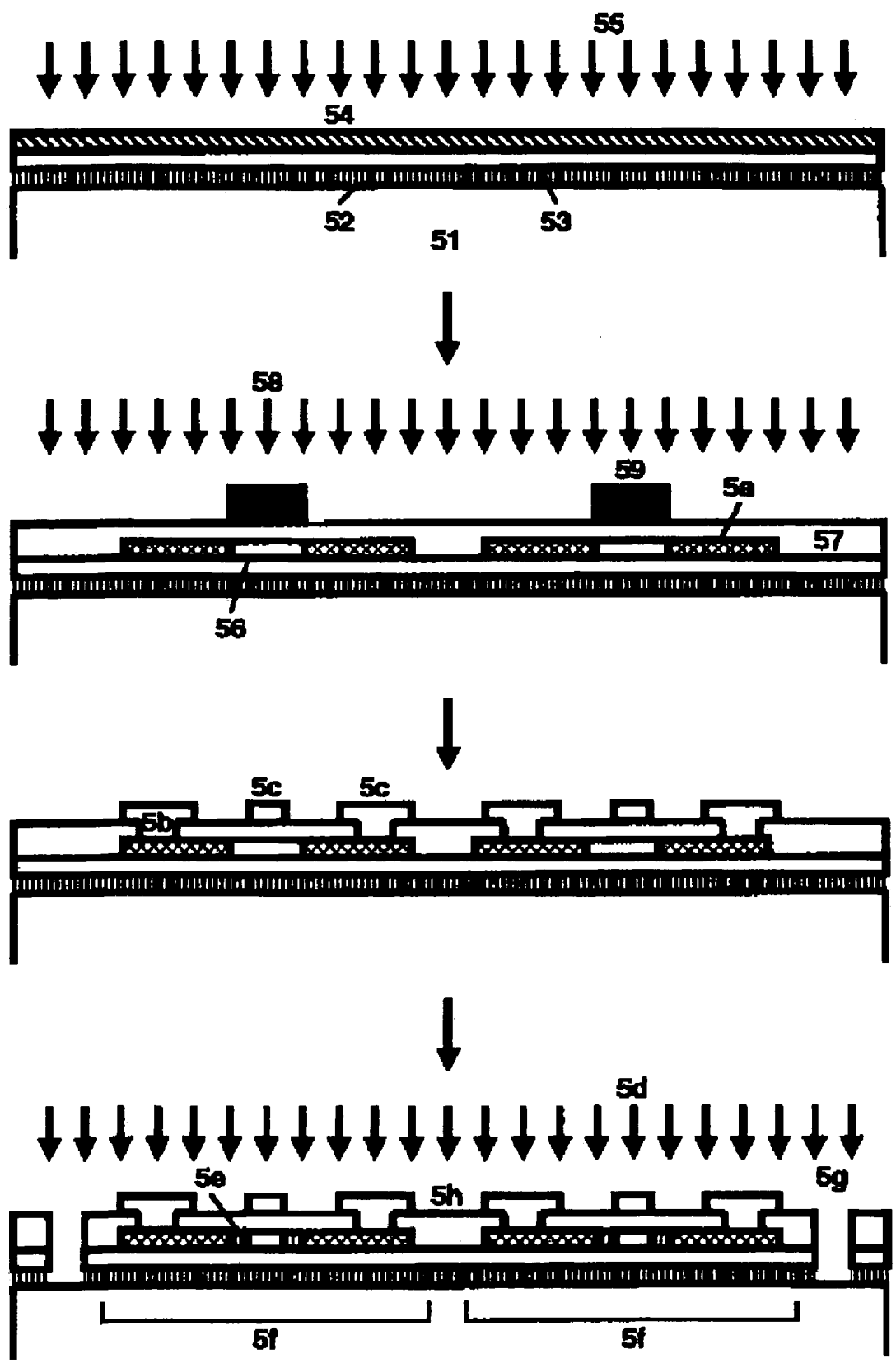
FIG. 5 is a schematic of a method of manufacturing an element chip according to an exemplary embodiment of the present invention.

FIG. 5 is a schematic of a method of manufacturing an element chip according to an exemplary embodiment of the present invention. A peeling layer 52 is formed on a first substrate 51, and a base insulating film 53 is formed on the peeling layer 52. An amorphous silicon (a-Si) layer 54 is deposited using PECVD of $SiH_4$ or LPCVD of $Si_2H_6$, is crystallized and patterned with laser irradiation 55 so as to obtain a polycrystalline silicon (poly-Si) layer 56. A gate insulating film 57 is deposited using PECVD, ECR-CVD, etc., of TEOS, a resist mask 59 is used to selectively implant dopant ions by ion implantation or ion doping 58, source/drain regions 5a are formed, and contact holes 5b are formed. Gate metal is deposited and patterned to obtain gate electrodes 5c. The gate electrodes 5c are also used as source/drain electrodes or connecting pads. The gate electrodes 5c are used to selectively implant dopant ions by ion implantation, ion doping, 5d, etc., to form lightly doped drain regions (LDD) 5e. Thin film transistors 5f are obtained from the above processes. Finally, element chips 5h are formed by separating with separators 5g. In FIG. 5, only one element chip 5h is illustrated. However, a number of element chips 5h is actually arranged.

In this exemplary embodiment, as defined in a first aspect, in the patterning process of the thin film transistors 44, holographic lithography is used. Further, as defined in a second aspect, in the patterning process of the thin film transistors 44, a dynamic auto focus system is used. Further, as defined in a third aspect, in the patterning process of the thin film transistors 44, a design rule of 1.0 μm or less is used. Further, only the polycrystalline silicon layer 41 and the first metal layer 42 are used as wiring lines of the element chip 45.

Moreover, in this exemplary embodiment, in the patterning processes of the polycrystalline silicon layer 41 and the first metal layer 42, holographic lithography and a dynamic auto focus system are used, and a design rule of line/space=1 μm/1 μm is used. However, even though the holographic lithography and the dynamic auto focus system are used in the patterning processes of other layers and then the design rule of line/space=1 μm/1 μm is used, the spirit of the present invention applies.

Further, the present invention can be applied to a liquid crystal electro-optical device which uses an active matrix substrate. The active matrix substrate of each of the above-mentioned exemplary embodiments to which the present invention is applied can reduce cost and enhance quality compared with an electro-optical device, which is manufactured using a related art active matrix substrate. Of course, although the liquid crystal electro-optical device is illustrated as the electro-optical device, the present invention can also be applied to other electro-optical devices, such as organic electroluminescent devices and electrophoresis display devices, for example.

Since the above electro-optical devices are mounted on electronic apparatuses, for example, portable telephones, etc., the present invention can allow electronic apparatuses to enjoy the above advantages.

What is claimed is:

1. A method of manufacturing a thin film transistor circuit substrate, comprising the steps of:

forming a plurality of element chips, each having at least one thin film transistor, on a first substrate via a peeling layer;

forming a wiring line on a second substrate;

pressingly attaching at least one element chip of the plurality of element chips in a predetermined position on the second substrate via an adhesive, and electrically connecting the at least one element chip and the wiring line; and peeling the at least one element chip from the first substrate, by irradiating a laser beam onto the peeling layer, after electrically connecting the at least one element chip and the wiring line;

wherein the step of forming the thin film transistor includes the steps of forming an amorphous silicon layer on the peeling layer, crystallizing the amorphous silicon layer by irradiating a laser beam thereonto, and then forming a polycrystalline silicon layer by patterning the crystallized amorphous silicon layer, forming an insulating film on the first substrate and the polycrystalline silicon layer, and forming the gate metal on the insulating film, and then forming a gate electrode by patterning the gate metal; wherein holographic lithography and a dynamic auto focus system are used for patterning the crystallized amorphous silicon layer and the gate metal;

stepper exposure is used for patterning other than patterning the crystallized amorphous silicon layer and the gate metal; and a design rule finer than a design rule used for the other patterning is used for patterning the crystallized amorphous silicon layer and the gate metal.

2. The method according to claim 1, further comprising using the design rule of 1.0 micron or less for the patterning of the crystallized amorphous silicon layer and the gate metal.

3. The method according to claim 1, the other patterning including the patterning of the crystallized amorphous silicon layer.

* * * * *